(12) United States Patent
Morrison

(10) Patent No.: US 11,721,951 B2
(45) Date of Patent: Aug. 8, 2023

(54) TUNABLE LASER WITH ACTIVE MATERIAL ON AT LEAST ONE END FOR MONITORING PERFORMANCE

(71) Applicant: Freedom Photonics LLC, Goleta, CA (US)

(72) Inventor: Gordon Barbour Morrison, Summerland, CA (US)

(73) Assignee: Freedom Photonics LLC, Goleta, CA (US)

(*) Notice: Subject to any disclaimer, the term of this patent is extended or adjusted under 35 U.S.C. 154(b) by 0 days.

(21) Appl. No.: 17/021,993

(22) Filed: Sep. 15, 2020

(65) Prior Publication Data

US 2023/0026260 A1    Jan. 26, 2023

Related U.S. Application Data

(60) Provisional application No. 62/901,089, filed on Sep. 16, 2019.

(51) Int. Cl.
| | | |
|---|---|---|
| *H01S 5/125* | (2006.01) | |
| *H01S 5/06* | (2006.01) | |
| *H01S 5/12* | (2021.01) | |
| *H01S 5/026* | (2006.01) | |
| *H01S 5/024* | (2006.01) | |
| *H01S 5/14* | (2006.01) | |

(52) U.S. Cl.
CPC ............ *H01S 5/125* (2013.01); *H01S 5/0262* (2013.01); *H01S 5/02415* (2013.01); *H01S 5/0612* (2013.01); *H01S 5/0614* (2013.01); *H01S 5/1209* (2013.01); *H01S 5/145* (2013.01)

(58) Field of Classification Search
CPC .... H01S 5/0262; H01S 5/0612; H01S 5/1209; H01S 5/02415; H01S 5/125
See application file for complete search history.

(56) References Cited

U.S. PATENT DOCUMENTS

| | | | |
|---|---|---|---|
| 10,320,152 B2 | 6/2019 | Morrison | |
| 10,355,451 B2 | 7/2019 | Morrison et al. | |
| 2002/0105991 A1* | 8/2002 | Coldren | H04B 10/2914 372/50.1 |
| 2007/0071050 A1* | 3/2007 | Kuramoto | H01S 5/026 372/43.01 |
| 2010/0111119 A1* | 5/2010 | Sato | H01S 5/141 372/20 |
| 2019/0372307 A1* | 12/2019 | Morton | H01S 5/1039 |

\* cited by examiner

*Primary Examiner* — Michael Carter

(74) *Attorney, Agent, or Firm* — Knobbe, Martens, Olson & Bear, LLP

(57) ABSTRACT

A laser comprising a laser cavity formed by a first optical reflector, a gain region, a second optical reflector having a plurality of reflection peaks, and at least one optically active region. The first mirror may be a DBR or comb mirror and the second mirror may be a comb mirror. The spectral reflectance of the second optical reflector is adjusted at least partially based on an electric signal received form the optically active region such that only one reflection peak is aligned with a cavity mode formed by the first and second reflector.

11 Claims, 11 Drawing Sheets

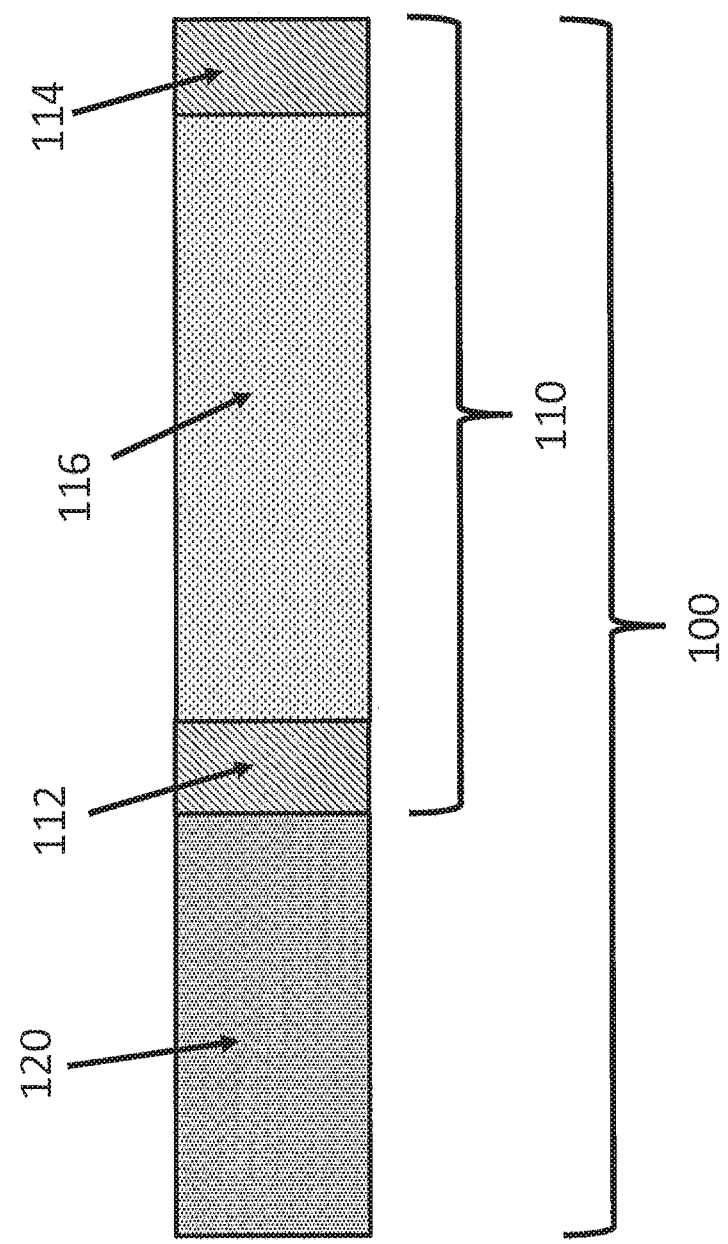

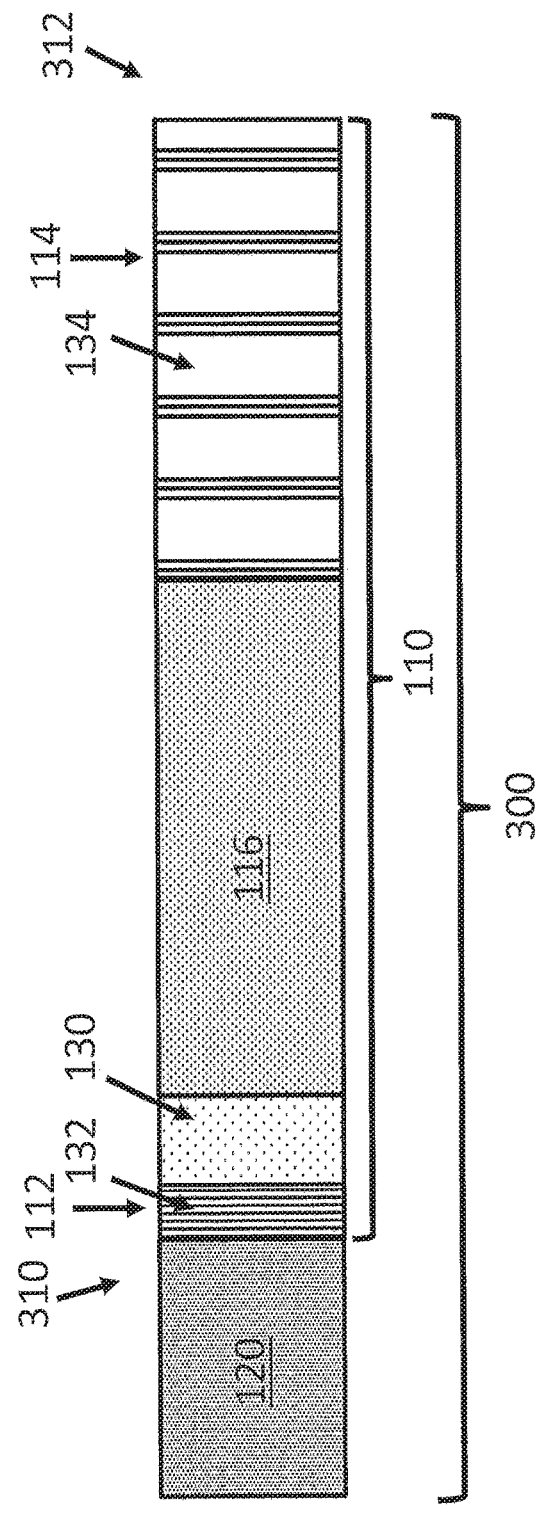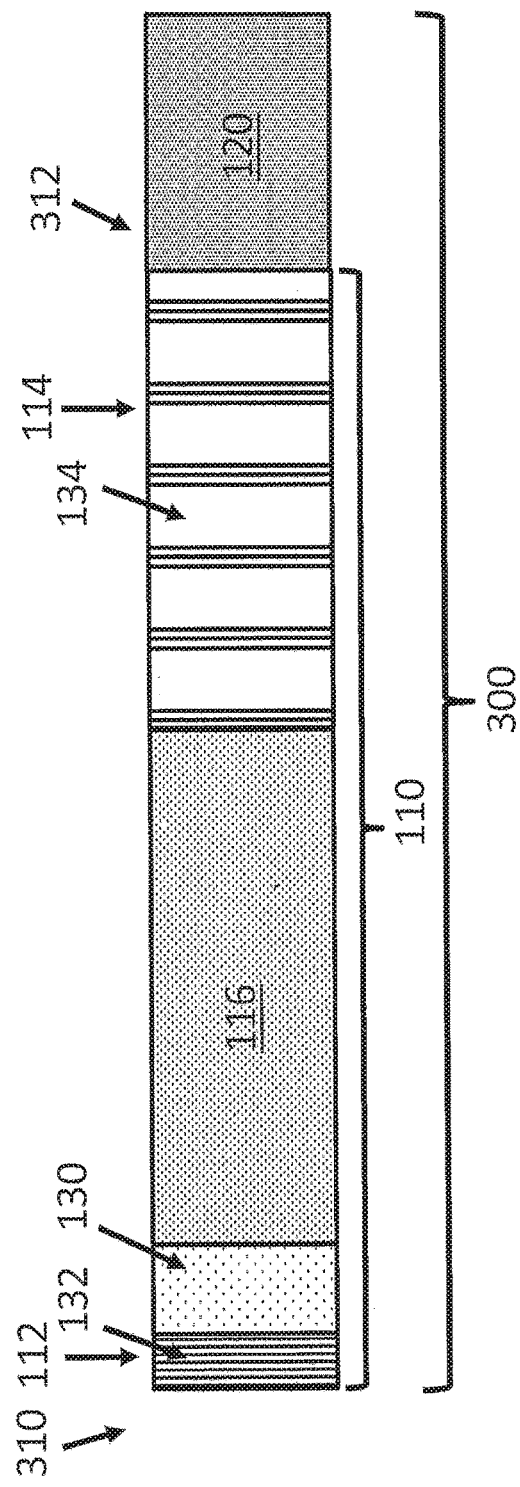

TUNABLE LASER WITH ACTIVE MATERIAL ON AT LEAST ONE END FOR MONITORING PERFORMANCE

INCORPORATION BY REFERENCE TO ANY PRIORITY APPLICATIONS

This application claims the benefit under 35 U.S.C. § 119(e) of U.S. Provisional Application No. 62/901,089 filed on Sep. 16, 2019 titled "TUNABLE LASER WITH ACTIVE MATERIAL ON AT LEAST ONE END FOR MONITORING PERFORMANCE", which is incorporated herein by reference in its entirety.

BACKGROUND

In optical telecommunication applications, lasers such as distributed Bragg reflector (DBR) or distributed feedback (DFB) lasers are routinely used to generate a single wavelength or frequency that stays within a predetermined frequency band associated with an optical channel. Aligning the laser frequency with an optical channel of an optical communication system (e.g., an optical data link) and maintaining such alignment during the operation of the system, is important for supporting high quality data transfer. As such lasers that can generate light with a stable wavelength within a predetermined band can be useful components in such optical systems.

SUMMARY

In one aspect described herein, an optical device is configured to generate light. The optical device comprises a laser comprising at least one first optical reflector, at least one second optical reflector, and at least one gain region between the at least one first optical reflector and the at least one second optical reflector, the at least one gain region configured to generate light. The optical device further comprises at least one optically active region, the at least one first optical reflector between the at least one active material region and the at least one gain region. The at least one optically active region is configured to generate at least one electrical signal indicative of light transmitted from the at least one gain region through the at least one first optical reflector.

In another aspect described herein, a method comprises providing an optical device (e.g., laser) comprising at least one gain region between at least one first optical reflector and at least one second optical reflector, the at least one gain region configured to generate light. The optical device further comprises at least one optically active region, the at least one first optical reflector between the at least one optically active region and the at least one gain region. The method further comprises applying an electrical voltage to the at least one optically active region such that the at least one optically active region generates at least one electrical signal indicative of light generated by and transmitted from the at least one gain region through the at least one first optical reflector. In certain embodiments, the method further comprises tuning a wavelength of the light generated by the at least one gain region, said tuning in response to the at least one electrical signal generated by the at least one optically active region. For example, as described herein, photocurrent signals from the at least one optically active region (e.g., positioned at the front end and/or the rear end of the laser) can be used to achieve cavity mode alignment to one or more reflection peaks from the at least one first optical reflector and the at least one second optical reflector. For another example, as described herein photocurrent signals from the at least one optically active region can be used to achieve alignment of the at least one first optical reflector to the at least one second optical reflector.

In another aspect described herein, an electrical signal (e.g., a voltage) measured across at least one gain region may be used as a feedback signal to align at least one reflection peak from the at least one second optical reflector to at least one reflection peak from the at least one second optical reflector, or to align a cavity mode to a reflection peak of the at least one first optical reflector and a reflection peak of the at least one second optical reflector.

In certain embodiments in which the first or the second optical reflectors comprises a comb mirror, the comb mirror is configured to be used as a wavelength reference for channel determination. In certain such embodiments, the comb mirror can be tuned by varying a temperature of the comb mirror to compensate for inaccuracies in the native reflection peak spacing of the comb mirror relative to an intended channel spacing (e.g., channel spacing associated with a reference frequency grid or a telecom frequency grid) and/or to achieve an effective reflection peak spacing that is smaller (e.g., half; quarter or other ratios) than the native reflection peak spacing of the comb mirror (e.g., the reflection peak spacing of the comb mirror at room temperature). For example, varying the temperature of the comb mirror a native reflection peak spacing of 200-GHz can be reduced to 50 GHz or 100 GHz to provide a smaller channel spacing.

BRIEF DESCRIPTION OF THE DRAWINGS

In the following description of the various embodiments, reference is made to the accompanying drawings which form a part hereof, and in which is shown by way of illustration various embodiments of the device.

It is to be understood that other embodiments may be utilized and structural changes may be made without departing from the scope of present invention.

FIG. 1 illustrates an embodiment of an optical device configured to generate light in accordance with certain embodiments described herein. The optical device includes first and second optical reflectors, a gain region and an optically active region.

FIG. 3A illustrates an embodiment of an optical device configured to generate light comprising an optically active region, a phase section, a gain region, a comb mirror (e.g., sampled grating distributed Bragg reflector or SGDBR), and DBR mirror wherein the DBR mirror and the phase section are disposed between the optically active region and the phase section.

FIG. 3B illustrates an embodiment of an optical device configured to generate light comprising a DBR mirror, a phase section, a gain region, an optically active region, and a comb mirror (e.g., sampled grating distributed Bragg reflector or SGDBR) wherein the comb mirror is disposed between the gain region and the optically active region.

DETAILED DESCRIPTION

Figure 2A:
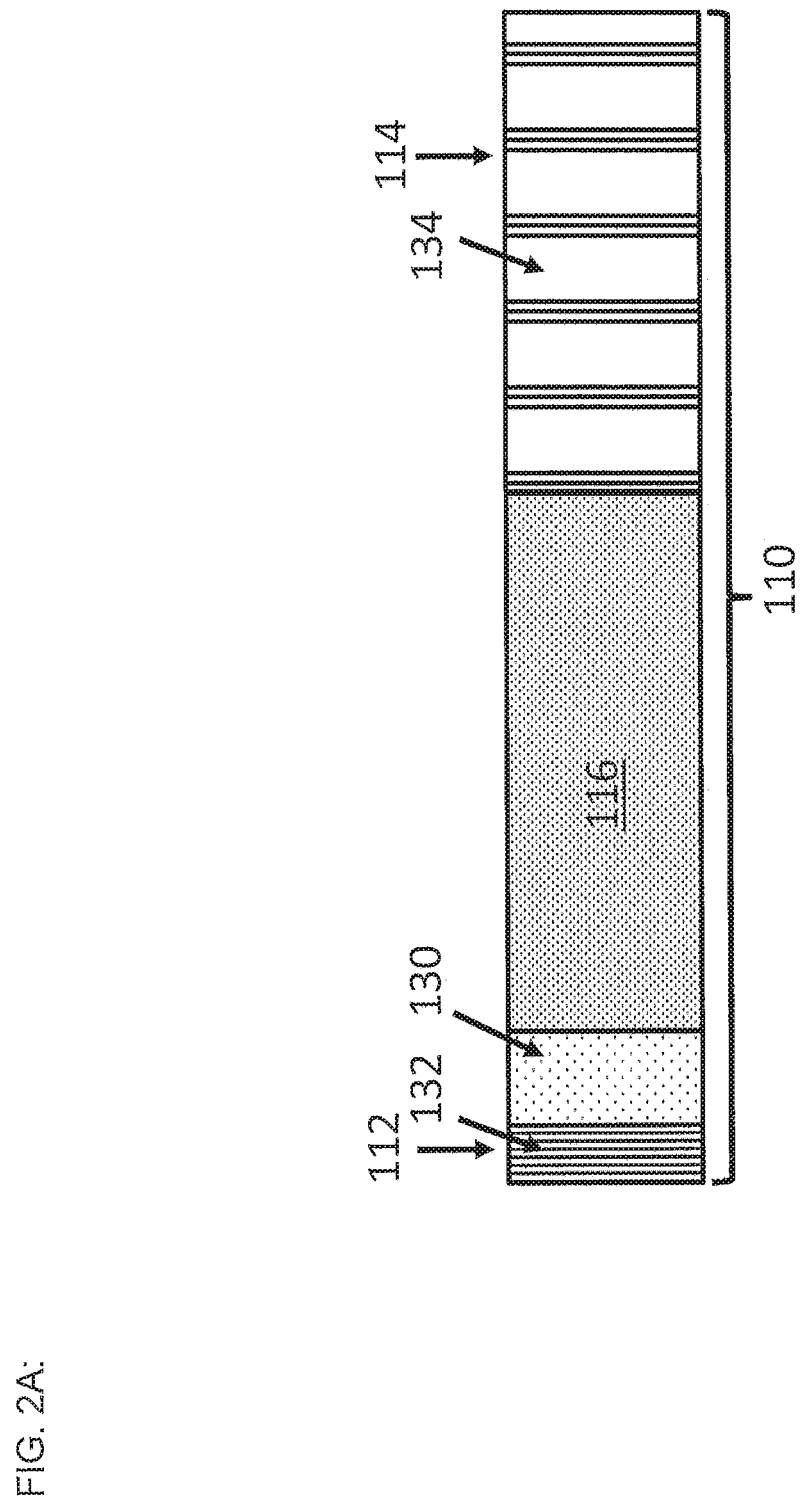
FIG. 2A illustrates an embodiment of an optical device configured to generate light in accordance with certain embodiments described herein. The optical device includes a DBR mirror, a comb mirror, a gain region and a phase section.

Certain embodiments described herein provide a method for frequency locking a single mode laser without the need for an external frequency reference. The components of various embodiments can be fabricated using any material or combination of materials some of which may exhibit the gain, optical activity, and/or photocurrent absorption as described herein, and/or allowing for fabrication of comb mirrors and/or DBR mirrors as described herein.

FIG. 1 schematically illustrates an example optical device 100 configured to generate light in accordance with certain embodiments described herein. The optical device 100 comprises a laser 110 comprising at least one first optical reflector 112, at least one second optical reflector 114, and at least one gain region 116 between the at least one first optical reflector 112 and the at least one second optical reflector 114, the at least one gain region 116 configured to generate light. The optical device 100 further comprises at least one optically active region 120, in the example shown, the at least one first optical reflector 112 between the at least one optically active region 120 and the at least one gain region 116. The at least one optically active region 120 is configured to generate at least one electrical signal indicative of light transmitted from the at least one gain region 116 through the at least one first optical reflector 112 to the at least one optically active region 120. In some embodiments, the first reflector and the second reflector may form a cavity comprising the gain region, the cavity having a plurality of cavity modes spaced apart from each other.

FIG. 2A schematically illustrates another example laser 110 in accordance with certain embodiments described herein. The example laser 110 of FIG. 2A (previously disclosed in U.S. Pat. No. 10,355,451 issued Jul. 16, 2019, and U.S. Pat. No. 10,320,152 issued Jun. 11, 2019, which are incorporated in their entirety by reference herein) can have a single mode laser design that utilizes at least one comb mirror (e.g., sampled grating distributed Bragg reflector or SGDBR) to allow tuning of the laser to multiple channels. For example, as schematically illustrated by FIG. 2A, the at least one first optical reflector 112 can comprise a distributed Bragg reflector (DBR) mirror 132, which can be strongly reflecting (e.g., reflectivity equal or greater than 25%; reflectivity equal or greater than 90%; reflectivity equal or greater than 95%; reflectivity in a range of 25% to 95%) or weakly reflecting (e.g., reflectivity equal or less than 50%; reflectivity equal or less than 10%; reflectivity equal or less than 5%; reflectivity in a range of 1% to 30%), and the at least one second optical reflector 114 can comprise a comb mirror 134, which can be strongly reflecting or weakly reflecting. In some examples, the comb mirror may have a plurality of reflection peaks (e.g., equal or greater than 25%; equal or greater than 90%; equal or greater than 95%; or between 25% and 95%), which may be substantially equal magnitudes in some embodiments. In some such examples, the reflection peaks of the comb mirror may be equally spaced in the spectral domain. In some examples, the DBR mirror may have at least one main reflection peak with a magnitude, for example, smaller than 50% for a weakly reflecting DBR mirror and larger than 50% for a strongly reflecting DBR mirror or having a magnitude of 50%. In some embodiments, the DBR mirror and the comb mirror may form a cavity including the gain region therein, the cavity having a plurality of cavity modes spaced apart from each other. The example laser 110 of FIG. 2A comprises the gain region 116 comprising at least one optically active material (e.g., multiquantum well heterojunctions formed in semiconductor materials, such as, for example, III-V semiconductor materials; hybrid integration of III-V semiconductor material with polymer, Si, SiN, or SiO$_2$ waveguides) and a phase section 130 within an optical cavity between the first and second optical reflectors 112, 114. The phase section 130 can be configured to controllably adjust the optical path length of an optical signal in the optical cavity between the first and second optical reflectors 112, 114. For example, electrical current (e.g., injection current configured to produce free carriers in the phase section 130) or an electrical voltage can be applied to the phase section 130 through electrical contacts (e.g., in proximity to the phase section 130) to alter the optical path length of the optical signal in the optical cavity. For another example, the optical path length of the optical signal in the optical cavity can be controllably adjusted by applying a temperature change in the phase section 130 (e.g., by applying an electric current through a resistive strip disposed on or near the phase section 130).

Figure 2B:
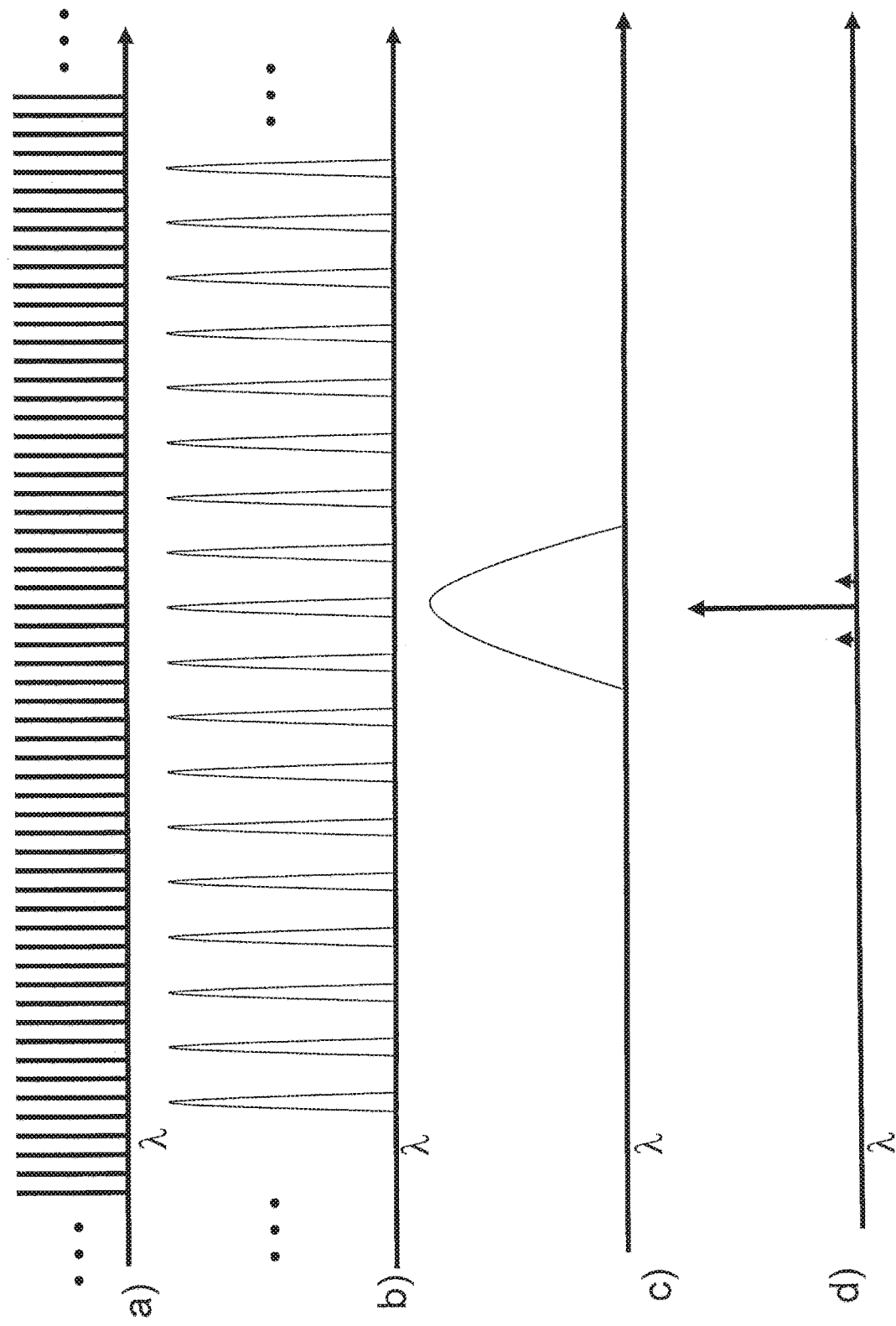
FIG. 2B schematically illustrates a process of mode selection in an optical cavity formed between a DBR mirror and comb mirror (e.g., sampled grating distributed Bragg reflector or SGDBR).

FIG. 2B schematically illustrates operation of the example laser 110 of FIG. 2A in accordance with certain embodiments described herein. In some examples, the operation comprises aligning a reflection peak of the comb mirror with a reflection peak of the DBR mirror and cavity mode. The cavity modes of the optical cavity are shown in FIG. 2B(a), and the reflection peaks of the comb mirror 134 are shown in FIG. 2B(b). The cavity modes can be densely spaced (e.g., have a spacing between adjacent cavity modes in a range of 0.02 nm to 2 nm or in a range of 0.1 nm to 0.4 nm), spacing between adjacent reflection peaks of the comb mirror 134 can be in a range of 0.2 nm to 14 nm or in a range of 1.5 nm to 12 nm, and the comb mirror 134 can be used to repeatedly sample the cavity modes. The main reflection peak of the DBR mirror 132 is shown in FIG. 2B(c), which can be used to sample or select, for example, a single reflection peak from the comb mirror 134 (e.g., an SGDBR). In certain embodiments in which the second optical reflector 114 comprises an SGDBR, the SGDBR can have a spacing between adjacent reflection peaks that is sufficiently large such that only one of the reflection peaks falls within the gain bandwidth of the gain region 116, and the comb mirror 134 is effectively a DBR with a single reflection peak. In some examples, lasing may occur at wavelengths at which a cavity mode lines up with a reflection peak of the comb mirror 134 and overlaps with the gain bandwidth of the gain region 116. In this way, the cavity modes which contribute to lasing within the gain region 116 can be selected by tuning the comb mirror 134. In some such examples, the cavity mode and at least one of the reflection peaks of the comb mirror may overlap with the main reflection peak of the DBR. The gain bandwidth of the gain region 116 can be −3 dB (e.g., ranging from 10 nm to 100 nm) and the optically active regions 120 can range from within about 20 nm blue of the gain peak of the gain region 116 to several hundred nm redder in certain implementations.

As shown in FIG. 2B(d), the above mentioned conditions may result in lasing by only a single cavity mode with a sufficiently high side mode suppression ratio (SMSR) (e.g., greater than 30 dB; greater than 60 dB). In other words, in some examples, when a reflection peak of the comb mirror only overlaps with one cavity mode and they both overall with the main reflection peak of the DBR, only one cavity mode is sustained within the cavity and the gain region resulting single mode laser oscillation (lasing). In these examples, the DBR mirror 132 selects one reflection peak from the comb mirror 134, which in turn selects a single cavity mode for the laser. In certain embodiments, the position of the cavity modes can be tuned by the phase section 130 (e.g., by temperature tuning using a heat from a heater or injection current into the phase section 130) and/or by the gain region 116 (e.g., by temperature tuning using heat from a heater or by injection current into the gain region 116). In certain embodiments, the position in wavelength space of the DBR mirror 132 and/or the comb mirror 134 can (i.e., the spectral position of the main reflection peak of the DBR and one or more reflection peaks of the comb mirror) may be tuned by temperature of the DBR mirror 132 and/or the comb mirror 134 can (e.g., using a temperature controllers such a heater or thermoelectric cooler) or by injecting current into the DBR mirror 132 and/or the comb mirror 134.

Figure 3C:
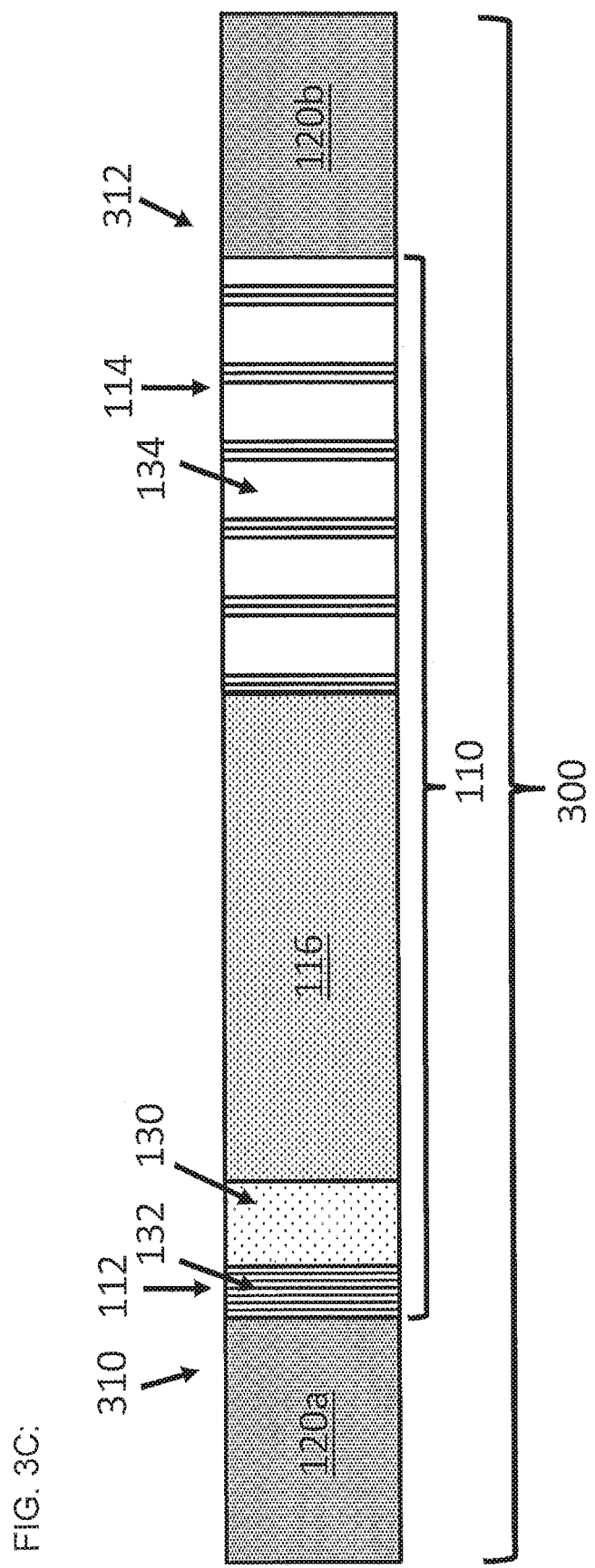
FIG. 3C illustrates an embodiment of an optical device configured to generate light comprising a first optically active region, a phase section, a gain region, a second optically active region, and a comb mirror (e.g., sampled grating distributed Bragg reflector or SGDBR) wherein the comb mirror is disposed between the gain region and the second optically active region, and the DBR mirror is disposed between the first optically active region and the phase section.

FIGS. 3A-3C schematically illustrate example optical devices 300 in accordance with certain embodiments described herein. Each of the optical devices 300 of FIGS. 3A-3C include the example laser 110 of FIG. 2A (previously disclosed in U.S. Pat. No. 10,355,451 issued Jul. 16, 2019, and U.S. Pat. No. 10,320,152 issued Jun. 11, 2019, which are incorporated by reference in their entirety herein) and further comprises at least one optically active region 120. The at least one optically active region 120 comprises at least one optically active material (e.g., multi-quantum well heterojunctions formed in semiconductor materials, such as, for example, III-V semiconductor materials; hybrid integration of III-V semiconductor material with polymer, Si, SiN, or $SiO_2$ waveguides). In certain embodiments, the at least one optically active material of the active material region 120 is the same as the at least one optically active material of the gain region 116, while in certain other embodiments, the at least one optically active material of the optically active region 120 is different from the at least one optically active material of the gain region 116. For example, the at least one optically active material of the optically active region 120 can have a band edge that is red-shifted (e.g., shifted towards lower energy) or blue-shifted (e.g., shifted towards higher energy) than the at least one optically active material of the gain region 116.

In certain embodiments, the at least one optically active region 120 is at a first end 310 (e.g., a front facet) of the optical device 300, at a second end 312 (e.g., a back facet) of the optical device 300, or at both the first end 310 and the second end 312. For example, as schematically illustrated by FIG. 3A, the DBR mirror 132 is between an optically active region 120 and the gain region 116, and the optically active region 120 is configured to generate at least one electrical signal indicative of light transmitted from the gain region 116 through the DBR mirror 132. As schematically illustrated by FIG. 3B, the comb mirror 134 is between an optically active region 120 and the gain region 116, and the optically active region 120 is configured to generate at least one electrical signal indicative of light transmitted from the gain region 116 through the comb mirror 134. As schematically illustrated by FIG. 3C, the DBR mirror 132 is between a first optically active region 120a and the gain region 116, and the comb mirror 134 is between a second optically active region 120b and the gain region 116. The first optically active region 120a is configured to generate at least one electrical signal indicative of light transmitted from the gain region 116 through the DBR mirror 132 and the second optically active region 120b is configured to generate at least one electrical signal indicative of light transmitted from the gain region 116 through the comb mirror 134. In certain embodiments, an optical modulator or other optoelectronics device can be added to one or both ends 310, 312.

The optically active region 120 of certain embodiments may be configured to be operated as a photodetector, for example, by biasing the optically active region 120 at a voltage of zero or a negative bias voltage (e.g., reverse biased) such that the optically active region 120 absorbs at least some of the light received from the laser 110 and generates at least one photocurrent signal indicative of absorbed light from the laser 110. In certain such embodiments, the bias voltage applied to the optically active region 120 can be set to a negative value (e.g., in a range of 0 to −5 V) selected such that the optically active region 120 acts as a shutter (e.g., absorbing substantially all of the light received from the laser 110; absorbing at least 90% of the light; absorbing at least 95% of the light), thereby preventing laser light from propagating out of the optical device 300). In certain other such embodiments, the bias voltage applied to the optically active region 120 can be set to a negative value (e.g., in a range of 0 to −5 V) selected such that the optically active region 120 acts as a variable optical attenuator (e.g., absorbing a predetermined fraction of the light received from the laser 110, the predetermined fraction dependent on the bias voltage) and the remaining unabsorbed fraction of the light is transmitted through the optically active region 120 to other optoelectronics devices in optical communication with the optical device 300.

The optically active region 120 of certain embodiments may be further configured to be operated as an amplifier (e.g., as a semiconductor optical amplifier or SOA). In some embodiments the optically active region may be configured to transmit light with certain amount of attenuation or no attenuation. In some embodiments the optically active region 120 may be configured to provide different functionalities when biased with different values of voltage. For example, when the optically active region 120 is forward biased (a positive bias voltage applied) an injection current may flow through the optically active region (e.g., in a range of 10 to 500 mA) causing the optically active region to function as amplifier. For example, the optical device 300 can be operated in a first mode (e.g., in at least a first time period) in which the at least one optically active region 120 is used to measure the amount of light received from the laser 110 (e.g., by generating a photocurrent indicative of the amount of received light absorbed by the optically active region 120), and in a second mode (e.g., in at least a second time period different from the first time period) in which the at least one optically active region 120 is used as an SOA (e.g., to amplify the amount of light emitted from the optical device 300 via the at least one optically active region 120).

In certain embodiments, when used as a photodetector, the photocurrent generated by the optically active region 120 is a measure of how well the cavity modes (see, e.g., FIG. 2B(a)) align with the reflection peaks of the comb mirror 134 (see, e.g., FIG. 2B(b)) and/or how well the DBR mirror 132 (see, e.g., FIG. 2B(c)) aligns with one of the reflection peaks of the comb mirror 134. For example, during time periods that the optically active region 120 is used as a shutter, the photocurrent generated by the optically active region 120 can be used to gauge the alignment of the cavity modes relative to the reflection peaks of the comb mirror 134, based on the magnitude of the measured photocurrent.

In certain embodiments, the photocurrent generated by the optically active region 120 can be used as a feedback signal for improving or optimizing performance of the optical device 300. For example, by adjusting one or more operating parameters of the optical device 300 (e.g., positions of one or more reflection peaks of the DBR mirror 132 and/or comb mirror 134); bias voltage or tuning current applied to the phase region 130) to alter (e.g., optimize) the photocurrent (e.g., altering or optimizing at least one of photocurrent value, photocurrent slope, and higher photocurrent derivatives as functions of the adjusted operating parameter), the side mode suppression ratio (SMSR) of the optical device 300 can be increased or optimized, even if aging of the various diode sections occurs over time. For example, the photocurrent readout as a function of mirror or phase tuning can be sampled at rates in a range of once per millisecond to one per 10 minutes (e.g., a range of 0.1 Hz to 1000 Hz). Dither current or voltage can be used on the section being tuned (e.g., dither current in a range of 0.01 mA to 20 mA and with a dither rate in a range of 100 Hz to 100 MHz).

Figure 4:
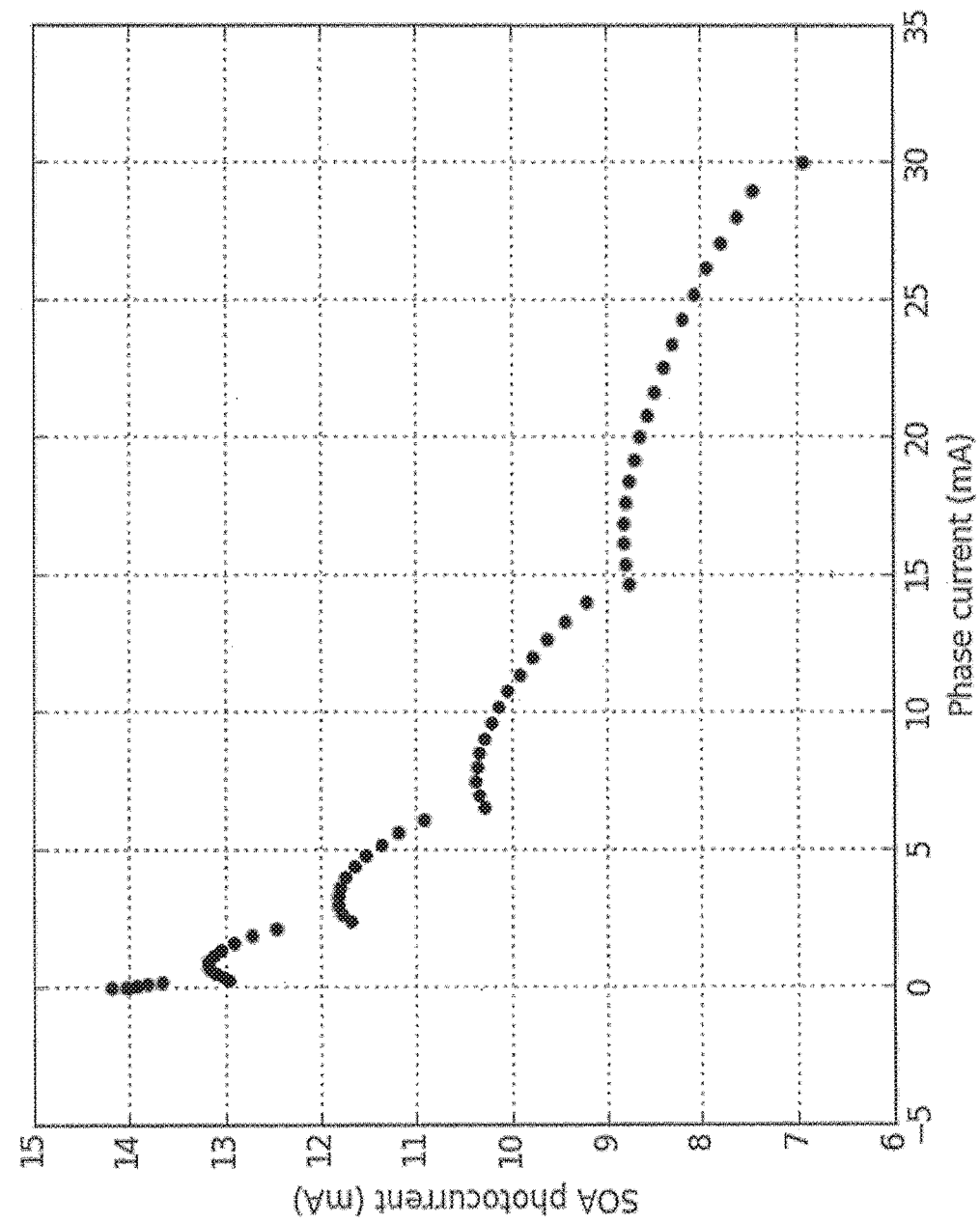
FIG. 4 illustrates the photocurrent generated by the optically active region at an output end (e.g., the optically active region of the optical device shown in FIG. 3A receiving light from the DBR mirror) plotted as a function of tuning current applied to the phase section (e.g., the phase section on the optical device shown in FIG. 3A) in accordance with certain embodiments described herein.

FIG. 4 shows the photocurrent generated by the optically active region 120 at an output end of the laser 110 (e.g., the front end 310, as shown in FIG. 3A) plotted as a function of tuning current applied to the phase section 130 in accordance with certain embodiments described herein. For example, the DBR mirror 132 can be weakly reflecting (e.g., reflectivity equal or less than 50%; reflectivity equal or less than 10%; reflectivity equal or less than 5%; reflectivity in a range of 1% to 30%) and the comb mirror 134 can be strongly reflecting (e.g., reflectivity equal or greater than 25%; reflectivity equal or greater than 90%; reflectivity equal or greater than 95%; reflectivity in a range of 25% to 95%). While the discussion below is with regard to the configuration shown in FIG. 3A (e.g., the optically active region 120 at the front end 310 or facet and the comb mirror 134 at the back end 312 or facet), other configurations are also compatible with certain embodiments described herein (e.g., comb mirror 134 at the front end 310 and the optically active region 120 at the back end 312 or facet; comb mirror 134 at the back end 312 or facet and the optically active region 120 at the back end 312 or facet).

As the tuning current applied to the phase section 130 (e.g., phase current) is adjusted, the cavity modes move relative to the reflection peak of the comb mirror 134 that is aligned with the gain bandwidth selected by the DBR mirror 132. When a cavity mode is aligned with the reflection peak of the comb mirror 134, the cavity mode receives a stronger feedback, and more output power is directed out of the DBR mirror 132 (e.g., the front mirror). Moreover, the threshold current of the laser 110 is reduced due to less mirror loss, and more output power is directed out of the DBR mirror 132. The discontinuities shown in FIG. 4 appear as cavity modes hop from one side of the mirror filter to the other. The local maxima in photocurrent represent regions where a single cavity mode is well-aligned with a reflection peak of the comb mirror 134 (e.g., providing increased SMSR). The net reduction in photocurrent as a function of the phase current between zero and 30 mA is due to the increased loss and heating as the phase current is biased. The spreading of the regions between cavity mode hops occurs because the responsivity of tuning decreases as the phase current increases.

In certain embodiments, by dithering or moving the phase current in small increments (e.g., in a range of ±0.01 mA to ±20 mA), and measuring (e.g., regularly sampling) the photocurrent change (e.g., indicative of the position of the cavity modes relative to the reflection peaks of the comb mirror 134), the cavity mode can be accurately tuned to be aligned with the reflection peak of the comb mirror 134 (e.g., providing increase SMSR of the laser 110 and reducing, minimizing, or eliminating multimode performance). For example, by adjusting the phase current in response to the photocurrent from the optically active region 120, the laser 110 is maintained to be well-aligned to the laser output throughout the lifetime of the laser 110 (e.g., as the laser 110 ages and the position in wavelength space of the cavity mode changes relative to that of the reflection peak of the comb mirror 134).

In certain embodiments, the magnitude of the photocurrent as a function of tuning current is used to select or optimize the phase current (e.g., setting the phase current to a value at which the photocurrent is increased or at a local maxima). In certain other embodiments (e.g., depending on the architecture of the optical device 300), the photocurrent as a function of tuning current may not have local maxima (e.g., as shown in FIG. 4) to target for locking cavity modes to the reflection peak of the comb mirror 134. In certain such embodiments, the photocurrent slope can be used (e.g., by tuning to be at an extremum of the slope or location of lower slope; by tuning to reduce or minimize the slope; by tuning to reduce the slope to zero or a negligible amount, or by tuning to a specific slope or range of slopes) and/or the second derivative of the photocurrent can be used (e.g., by tuning to reduce or minimize the second derivative; by tuning to reduce the second derivative to zero) to select or optimize the phase current or mirror current (or phase heater or mirror heater).

Figure 8B:
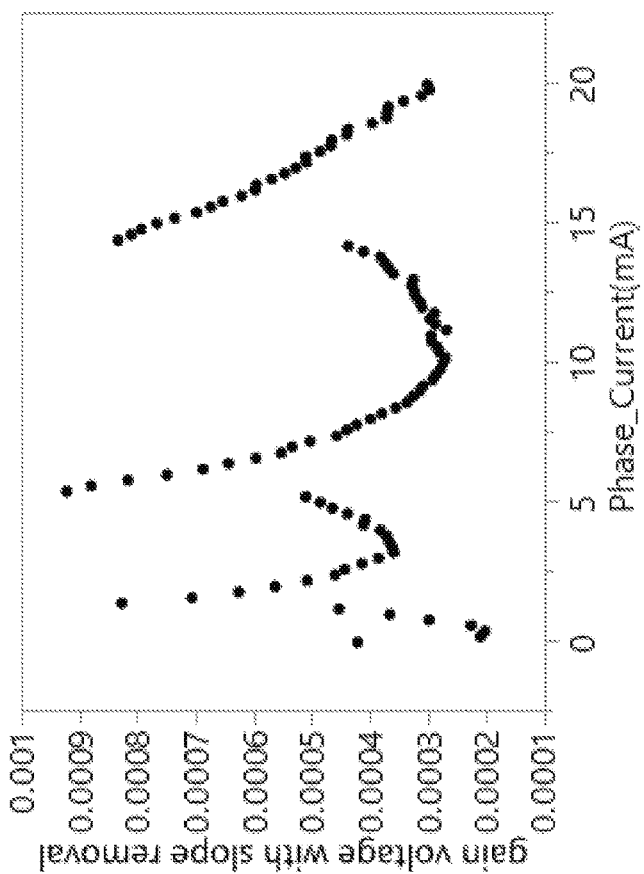
FIG. 8B illustrates a calculated adjusted voltage, calculated based on the measured voltage across the gain region shown in FIG. 8A, plotted as a function of tuning current applied to the phase section in accordance with certain embodiments described herein.
Figure 8A:
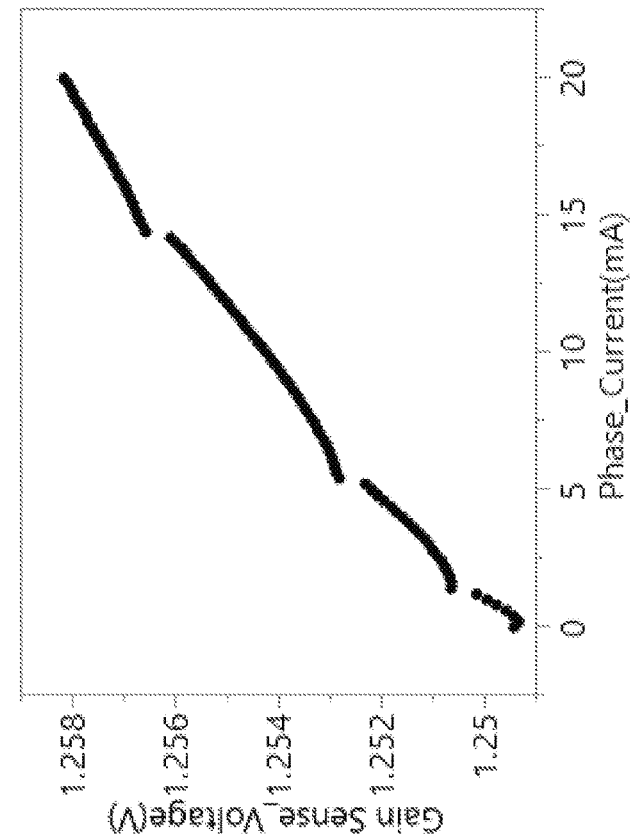
FIG. 8A illustrates the voltage measured across the gain region of the optical device (e.g., the optical device shown in FIG. 3A, 3B, or 3C) plotted as a function of tuning current applied to the phase section in accordance with certain embodiments described herein.

In some embodiments, a measured voltage across the gain section 116 may be used as a feedback signal to adjust or optimize the alignment between a cavity mode and a reflection peak of the comb mirror 134. In some embodiments, a local minimum of the measured voltage, for example, as a function of the current injected to phase section 130 may be used to align a cavity mode and a reflection peak of the comb mirror 134. In some other embodiments, a slope of the measured voltage (e.g., a slope corresponding to the change of the measured voltage as a function of the current injected to the phase section) may be used to align a cavity mode and a reflection peak of the comb mirror 134 (e.g., by tuning the current injected to the phase section 130: to bring the measured voltage to an extremum of the slope, to reduce or minimize a slope of the measured voltage, to reduce a slope to zero or a negligible amount). In some examples, the alignment between a reflection peak of the comb mirror 134 and a cavity mode may be achieved using the second derivative of the measured voltage as a function of the injected current to the phase section 130. For example, the reflection peak of the comb mirror and a cavity mode may be aligned by tuning the current injected to the phase section 130 (and therefore the cavity mode), to minimize a second derivative of the measured voltage or to reduce the second derivative of the measured voltage to zero (or a negligible amount). In some examples, instead of current injected to the phase section 130, the cavity mode may be controlled using a temperature controller that locally controls the temperature of the phase section 130. In these examples, the above mentioned methods may be implemented by controlling the temperature of the phase section 130 and using the measured voltage across the gain section 116 as a function of the temperature of the phase section. FIG. 8A shows the measured voltage across the gain section 116 in an example laser plotted as a function of the tuning injection current applied to the phase section 130 in accordance with certain embodiments described herein (e.g., laser 110 in FIG. 2A)). In some examples, the larger measured voltage across the gain region 116 at the larger values of the tuning injection current injected to the phase section 130 may be associated with additional optical loss in phase section 130 induced by the tuning current. In some such examples, a polynomial fit to the measured data (i.e., measured voltage across the gain region shown in FIG. 8A), may be used to transform or adjust the data to facilitate capturing the small variations of the measured voltage across the gain region. In some such examples, the transformation may include subtracting the polynomial fit from the measured data. FIG. 8B shows an example of such transformation or adjustment wherein a polynomial fit to the data shown in in FIG. 8A has been calculated and then subtracted from the measured data. In FIG. 8A and FIG. 8B the injection current applied on the phase section 120 is changed to scan over more than one cavity mode. The adjusted data shown in the FIG. 8B comprises of visible and easily distinguishable peaks and valleys that may be used to tune and lock a cavity mode to a reflection peak of the comb mirror (e.g., by tuning the current injected to the phase section 130). In some embodiments, the procedure described above (e.g., subtracting a polynomial fit from the measured data) may be used calculate an adjusted photocurrent using the measured photocurrent generated by the optically active region 120 and use the adjusted photocurrent to tune the cavity mode (e.g., by tuning the phase section 130), or the reflection peak (e.g., the main reflection peak) of the DBR mirror 132 (the first optical reflector), or a reflection peak of the comb mirror 134, such that they become aligned. In these embodiments, the phase section 130, the reflection peak of the DBR mirror 132 or the reflection peak of the comb mirror 134, may be tuned using independent injection currents applied to one or more of these components or by controlling the temperature of one or more of these components using one or more temperature controllers.

In certain embodiments, the photocurrent from the at least one optically active region 120 (e.g., at the front end 310 and/or at the back end 312) can be used to select or optimize alignment of the first optical reflector 112 and the second optical reflector 114. For example, for an optical device 300 in which the first optical reflector 112 comprises a first comb mirror 134 and the second optical reflector 114 comprises a second comb mirror 134, or for an optical device 300 in which the first optical reflector 112 comprise a comb mirror 134 and the second optical reflector 114 comprises a DBR mirror 132, the photocurrent can be used to align the first and second optical reflectors 112, 114 in wavelength space.

In certain embodiments, the at least one comb mirror 134 of the laser 110 can be held constant with no injection current such that the at least one comb mirror 134 does not age due to current injection and the reflection peaks of the at least one comb mirror 134 remain in a constant position in wavelength space. For example, an optical device 300 configured for telecommunications can comprise a comb mirror 134 for which the reflection peaks (e.g., channels) have a predetermined channel spacing (e.g., 50 GHz; 100 GHz).

Figure 5:
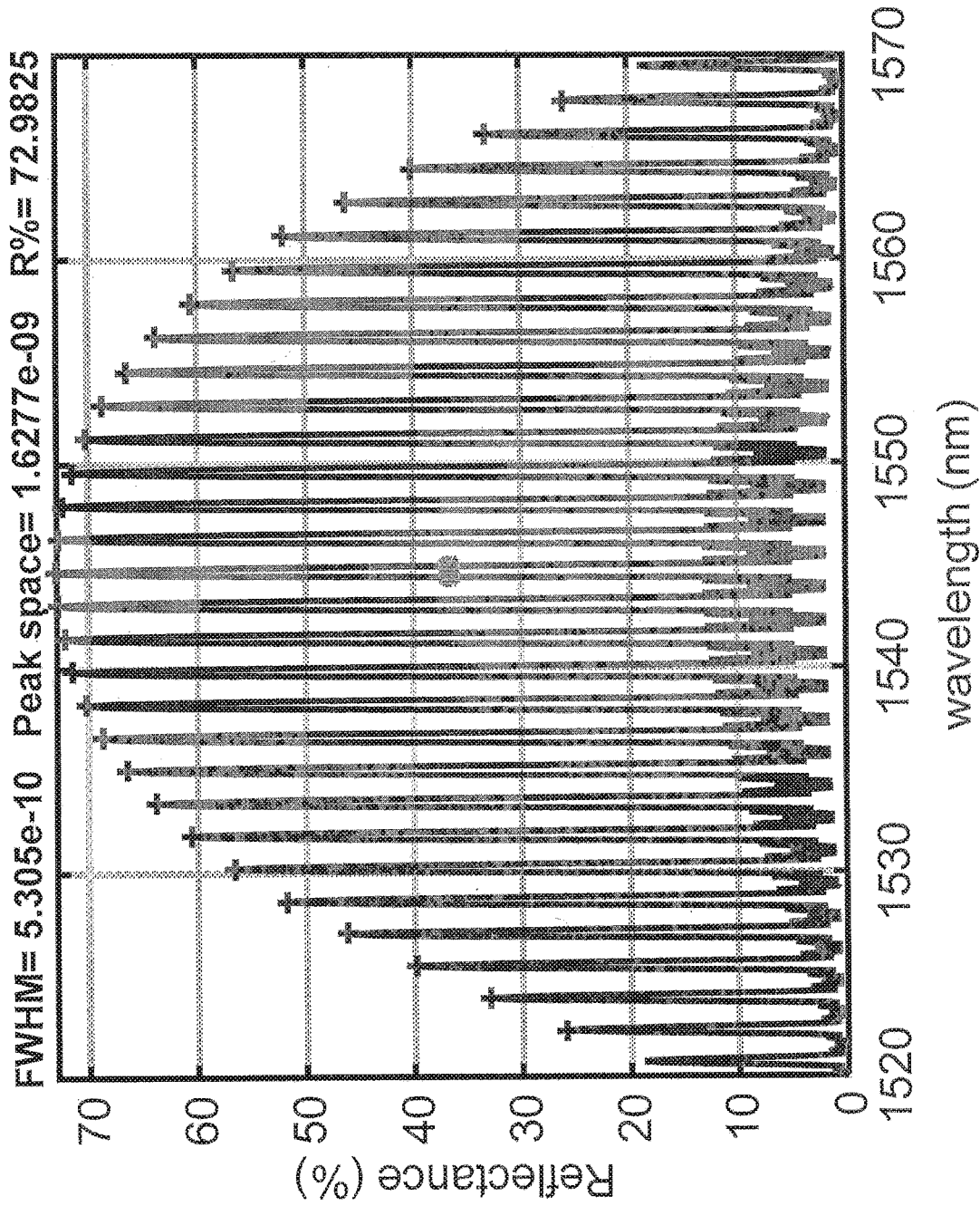
FIG. 5 illustrates a plot of the reflection peaks of an example comb mirror (e.g., sampled grating distributed Bragg reflector or SGDBR) which can be used as a reference for 200-GHz channel spacing, in accordance with certain embodiments described herein. The reflection peaks shown in this plot have a channel spacing of approximately 200 GHz.

In certain other embodiments, the comb mirror 134 can have a larger channel spacing (e.g., 200 GHz) and the temperature of the comb device 134 (e.g., temperature of the laser 110) can be used to tune the wavelengths of the reflection peaks to a grid or plurality of channels having a desired spacing and location in wavelength space, that have a smaller channel spacing (e.g., 50 GHz; 100 GHz). FIG. 5 shows a plot of the reflection peaks of an example comb mirror 134 which can be used as a reference for 200-GHz channel spacing, in accordance with certain embodiments described herein. The reflection peaks shown in FIG. 5 have a channel spacing of approximately 200 GHz, and a smaller channel spacing (e.g., 100 GHz, which corresponds to about 0.8 nm at 1538 nm in wavelength space) can be achieved by tuning the temperature of the comb mirror 134, with the temperature change dependent on the material on which the comb mirror 134 resides and the wavelength to be produced. For example, in the optical device 300 schematically illustrated by FIG. 3A, the comb mirror 134 can be on InP material and the temperature tuning coefficient for the comb mirror 134 can be about 0.1 nm per degree Celsius, at a wavelength of 1535 nm, so an appropriate mirror shift for a 100-GHz channel spacing can be achieved with a temperature change on the order of 8 degrees Celsius. Certain other embodiments can use a comb mirror 134 with more widely-spaced reflection peaks (e.g., spacings of 25 GHz; 100 GHz; 200 GHz; 300 GHz; 500 GHz or in any range formed by any of these values) and larger temperature tuning ranges to address all the channels (e.g., up to ±40 degrees Celsius). By using temperature tuning (e.g., local temperature tuning of the comb mirror, or global temperature tuning of the optical device or laser) rather than injection current tuning for the comb mirror 134, certain embodiments advantageously reduce (e.g., avoid) errors that may result from DBR mirror aging, and/or the comb mirror 134 aging due to continuous current flow. In the absence of these errors and by keeping the temperature of eth comb mirror fixed, the reflection peaks of the comb mirror may be used as an absolute or near-absolute wavelength/frequency reference.

Figure 6:
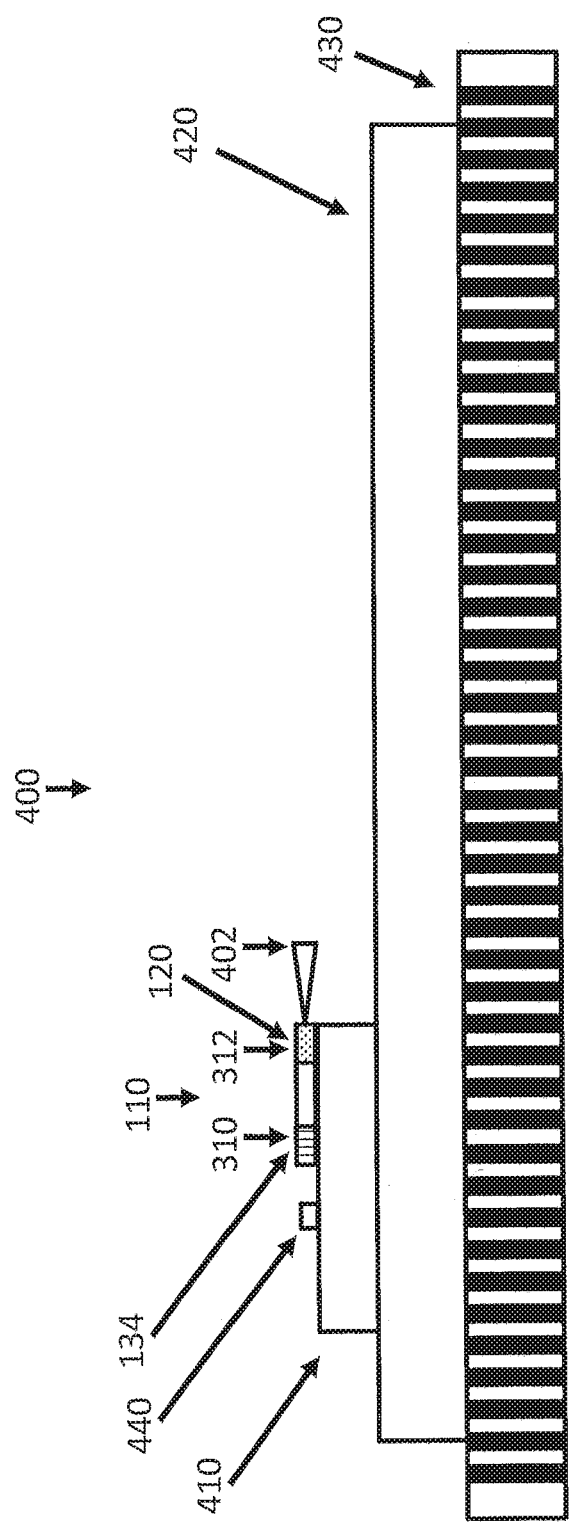
FIG. 6 illustrates an example optical device (e.g., the optical device shown in FIG. 3A, 3B, or 3C) comprising a temperature controlled reference comb mirror, a substrate, an optical bed and a temperature controller (e.g., a thermoelectric cooler) that controls the temperature of the comb mirror.

FIG. 6 schematically illustrates an example optical device 400 comprising at least one temperature controlled reference comb mirror 134 in accordance with certain embodiments described herein. The example optical device 400 of FIG. 6 comprises a laser 110 (e.g., as described herein in relation to FIGS. 2A-2B) comprising at least one comb mirror 134 (e.g., at a first facet 310 serving as an output from which laser light 402 generated by the laser 110 is emitted). For example, the laser light 402 emitted from the optical device 400 can be provided to one or more lenses, waveguides, or other optoelectronics components (not shown). The optical device 400 further comprises at least one optically active region 120 (e.g., as described herein in relation to FIGS. 3A-3C). For example, the optically active region 120 can be at a second facet 312 opposite from the output. The optical device 400 further comprises a substrate 410 (e.g., chip; carrier; comprising one or more of: AN, AlOx, Si, ceramics, SiC, metals), an optical bed 420 (e.g., comprising one or more of: ceramics, metals, Kovar, copper tungsten, titanium, copper), and a thermoelectric cooler 430 (e.g., available from Marlow, Remtec, Tecmicrosystems, Amstech, Ferrotech). The laser 110 and the at least one optically active region 120 are in thermal communication with the substrate 410 (e.g., are on a surface of the substrate 410), the substrate 410 is in thermal communication with the optical bed 420 (e.g., is on a surface of the optical bed 420), and the optical bed 420 is in thermal communication with the temperature controller 430 (e.g., a thermoelectric cooler, a resistive heater and the like). In some examples, the optical bed 420 may be on a surface of the temperature controller 430. In some embodiments, the optical bed 420 may be eliminated and the substrate 410 may be in direct thermal communication with temperature controller 430 (e.g., the substrate 410 may be on a surface of the temperature controller 430.

In some examples, the temperature controller 430 may be configured to controllably adjust a temperature of the comb mirror 134 such that the reflection peaks of the at least one comb mirror 134 are at predetermined positions in the wavelength or frequency space. For example, the temperature of the at least one comb mirror 134 may be adjusted by the temperature controller such that the spectral positon of the reflection peaks of the comb mirror become aligned with the spectral positions of the channels of a reference frequency grid (or wavelength grid). For example, the temperature of the comb mirror may be adjusted to align the spectral position of the reflection peaks of the comb mirror 134 with a frequency grid used for fiber-optic communication defined relative to a reference frequency (e.g., 194 THz) and with a given channel spacing (e.g., 50 GHz or 100 GHz). In some example, temperature tuning of the reflection peaks of the comb mirror comprises tuning the positon of the reflection peaks (e.g., relative to the reference frequency component of the frequency grid) and changing the spacing between the reflection peaks relative the a native spacing of the reflection peaks (e.g., at room temperature).

In some embodiments, the laser frequency (the optical frequency of the cavity mode sustained and amplified inside the optical device) may be locked to a user selected frequency (e.g., equal to a frequency of a frequency grid or within a bandwidth around a frequency of the a frequency grid) by tuning the temperature of the comb mirror 134 (e.g., using the temperature controller 430) and independently controlling the temperature of the phase section 130 and the DBR mirror 132 (or the first optical reflector). In some such embodiments, the comb mirror can be calibrated separately using, for example, an optical spectrum analyzer (OSA) and the temperature controller 430 may be used to determine a relation between the temperature measured via the temperature sensor element 440 and the alignment between spectral position of the reflection peaks of the comb mirror 134 and the discrete frequencies of a reference frequency grid (e.g., a reference frequency grid associate with channels of an optical communication system). In some cases, a look-up table wherein the temperature at which a certain alignment between the spectral position of the reflection peaks of the comb mirror 134 and the discrete frequencies of a reference frequency grid can be achieved are recorded.

In some embodiments, the temperature of the comb mirror 134 may be tuned and stabilized at a target temperature (e.g., associated with a target certain alignment between the spectral position of the reflection peaks of the comb mirror 134 and the discrete frequencies of a reference frequency grid or telecom frequency grid), using the temperature controller, the temperature sensor 440 and an electronic control circuit (e.g., a feedback control circuit such as a PID controller). In some such embodiments, the target temperature associated with a target alignment between the spectral position of the reflection peaks of the comb mirror 134 and the discrete frequencies of a reference frequency grid) may be selected by a user of the optical device or laser to tune the wavelength/frequency (e.g., a single wavelength/frequency) generated by the optical device or laser to a frequency component in the reference frequency grid (e.g., a telecom frequency grid).

In these embodiments, once the temperature of the comb mirror is selected, tuned and stabilized, the temperature of the phase section 130 and the DBR mirror 132 may be independently controlled to align and lock the reflection peak (e.g., the main reflection peak) of the DBR mirror 132 and the frequency of cavity mode to the a selected reflection peak of the comb mirror 134 at least partially based on a feedback signal (e.g., a photocurrent or a voltage) received from the optically active region 120 or the gain region 116. In some cases, an automatic control system may control the temperature of the phase section 130 and the DBR mirror 132 (e.g., using local temperature controllers or local current injection), at least partially based on a feedback signal (e.g., a photocurrent or a voltage) received from the optically active region 120 or the gain region 116. In some examples, the locking methods described above (e.g., with reference to FIG. 4 and FIG. 8), may be used to lock the reflection peak (e.g., main reflection peak) of the DBR mirror 132 and the cavity mode to a reflection peak of the comb mirror 134 using a feedback signal (e.g., the feedback signal received from the optically active region 120 or the gain region).

In some of the embodiments mentioned herein, one or more thermal isolation layers or sections may be disposed between different sections and regions to enable or facilitate the independent temperature control of the comb mirror 134, the phase section 130 and the DBR mirror 132.

In some of the embodiments mentioned herein, the comb mirror 134, the phase section 130 and the DBR mirror 132 may have electrical contacts.

In some examples, the temperature controller 430, the temperature of the phase section 130, the DBR mirror, or the temperature of the comb mirror 134 may be controlled by one or more electronic circuits (electronics). In some such examples, the electronic circuits may control the temperature of the phase section 130, the DBR mirror 132, or the comb mirror 134 by controlling currents injected to each one of these components (e.g., currents that are independently controlled). In yet other examples, the electronic circuits may control the temperature of the phase section 130, the DBR mirror 132, or the comb mirror 134 by controlling temperature controllers that control the temperature of each one of these components (e.g., temperature controllers that are independently controlled)

In some examples, the temperature controller 430, the temperature of the phase section 130, the DBR mirror, and the temperature of the comb mirror 134 may be controlled using one or more processors and based on a set of machine readable instructions. In some such examples, the one or more processors may be processors in a computing system (e.g., a digital computing system). In these examples the computing system may comprise a storage or memory where the machine readable instructions may be stored. The computing system may further comprise a user interface wherein user instructions and commands (e.g., related to selecting a specific frequency of a reference frequency grid) can be received. In some examples, the look up table described above may be included in the instructions stored in a memory of the computing system.

In some examples, the reflection peak (e.g., the main reflection peak) of the DBR mirror may be tuned to a frequency of a reference frequency grid) and the cavity mode and a reflection peak of the comb mirror 134 may be aligned with the reflection peak of the DBR mirror 132.

In certain embodiments, the optical device 400 further comprises at least one temperature sensor 440 (e.g., thermocouple; thermistor; FH05 thermistor available from Mitsubishi) configured to generate at least one signal indicative of a temperature of the laser 134 (e.g., a temperature of the at least one comb mirror 134). For example, the at least one temperature sensor 440 can be on the laser 110, on the at least one comb mirror 134, and/or sufficiently close to the at least one comb mirror 134 (e.g., on the same surface of the substrate 410 as is the at least one comb mirror 134) such that the at least one signal generated by the at least one temperature sensor 440 is indicative of a temperature of the at least one comb mirror 134 (e.g., in real-time as the optical device 400 is operated). In certain embodiments, the temperature of the at least one comb mirror 134 indicated by the at least one signal generated by the at least one temperature sensor 440 is used to determine the temperature-dependent position of the reflection peaks of the at least one comb mirror 134. In certain other embodiments, the at least one signal generated by the at least one temperature sensor 440 is used as a feedback signal for controlling the thermoelectric cooler 430 such that the temperature of the at least one comb mirror 134 is adjusted to equal a predetermined value.

Figure 7:
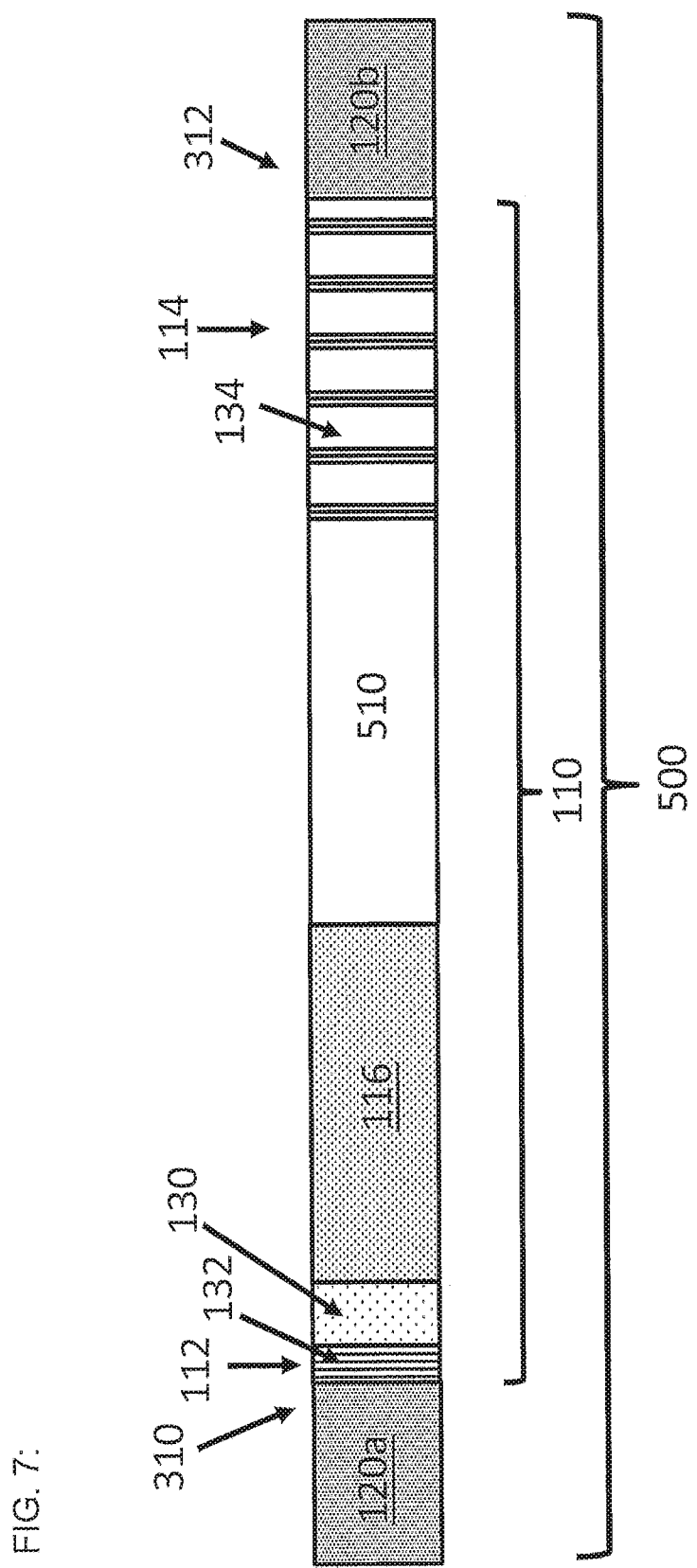
FIG. 7 illustrates an embodiment of an optical device shown in FIG. 3C that further includes a passive optical waveguide region between the active region and the comb mirror.

FIG. 7 schematically illustrates an example optical device 500 in which the at least one comb mirror 134 of the laser 110 is used as a wavelength reference in accordance with certain embodiments described herein. The optical device 500 of FIG. 7 comprises at least one passive waveguide or passive waveguide region 510 between the at least one gain region 116 and the at least one comb mirror 134 such that the at least one comb mirror 134 is spaced from the at least one gain region 116 (e.g., in a range of 10 to 100 microns; in a range of 100 to 1000 microns). The optical device 500 of FIG. 7 further comprises a first optically active region 120a and a DBR mirror 132 at a first end 310 of the optical device 500 and a second optically active region 120b and a comb mirror 134 at a second end 312 of the optical device 500, the second end 312 opposite to the first end 310. The DBR mirror 132 is configured to be used to select a wavelength from the temperature-tunable wavelength reference provided by the comb mirror 134.

In certain embodiments, the passive waveguide region between the at least one comb mirror 134 and the at least one gain region 116 is sufficiently large so that the at least one comb mirror 134 is thermally isolated from the at least one gain region 116 (e.g., the temperature of the at least one comb mirror 134 is substantially independent from the temperature of the at least one gain region 116) (e.g., more than a factor of 1.5 more isolated than when not spatially separated from the gain region 116). For example, as the at least one gain region 116 ages (e.g., due to the injection current applied to the at least one gain region 116 over time), higher injection currents can be applied to the at least one gain region 116 to operate the laser 110. However, these higher injection currents can generate resistive heating near the at least one gain region 116. The at least one passive waveguide 510 of the example optical device 500 of FIG. 7 is configured to reduce (e.g., eliminate) heat from the at least one gain region 116 from affecting the at least one comb mirror 134 (e.g., thermal crosstalk) that might otherwise influence the positions of the reflection peaks of the at least one comb mirror 134. In certain embodiments, additional passive waveguides or waveguide regions can be used to thermally isolate the at least one gain region 116 from the at least one optically active region 120 and/or to thermally isolate the at least one comb mirror 134 and/or the DBR mirror 132 from the at least one optically active region 120.

Figure 9:
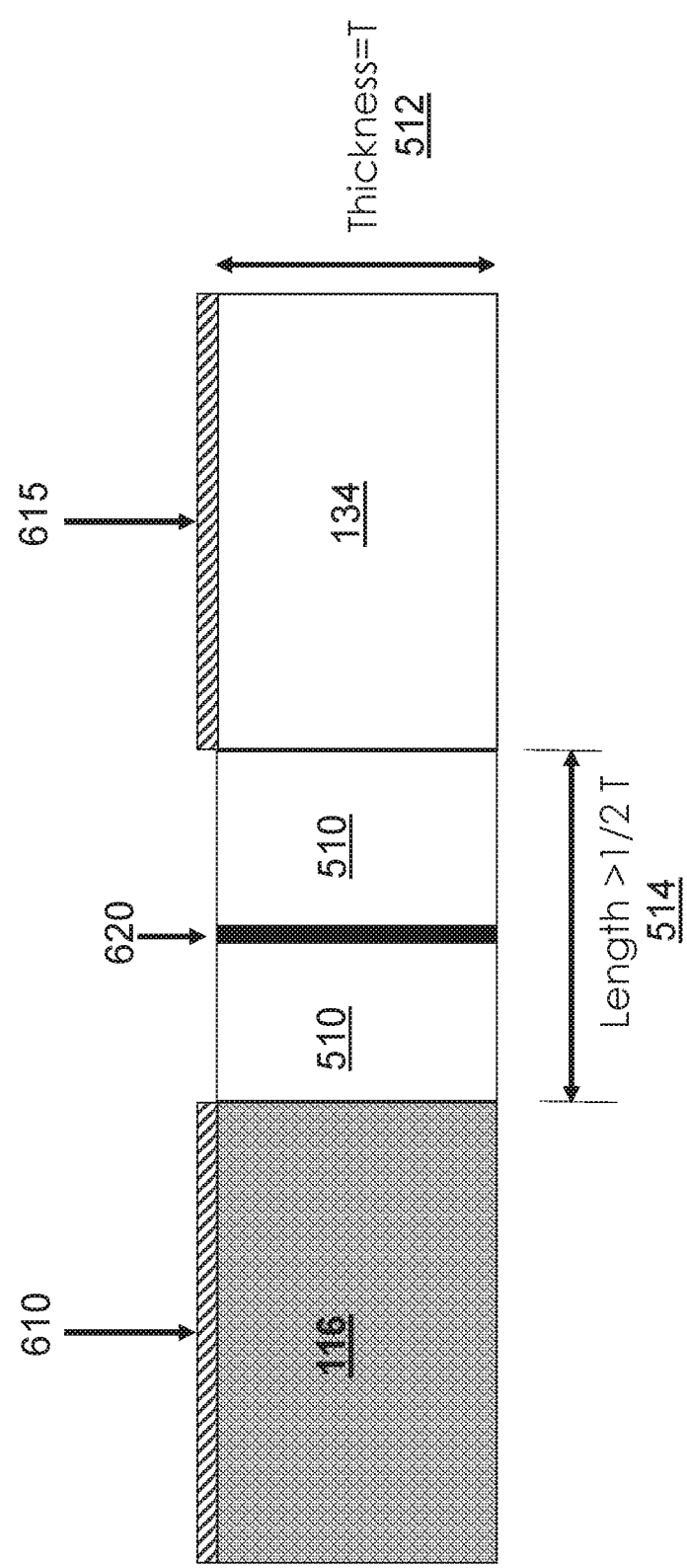
FIG. 9 illustrates an embodiment of an optical device shown in FIG. 7 that further includes an electrical isolation layer within the passive optical waveguide.

In some embodiments, a passive waveguides may be used to thermally isolate the phase section from other sections or regions (e.g., the gain region) that may have a temperature different than the phase section (e.g., sections or regions that are thermally tuned using an injection current or temperature controllers). FIG. 9 illustrates a section of an embodiment of an optical device shown in FIG. 7 wherein a passive waveguide 510 thermally isolates the gain region 116 from the comb mirror 134. In this example, a contact (e.g., a conductive layer) 610 may be disposed on the gain region to inject current to the gain region 116 and another contact may be disposed on the comb mirror 134. The passive waveguide 510 is designated by the lack of any contacts. In some embodiments, an electrical isolation layer 620 may be created inside the passive waveguide 510 (e.g., in the middle of the waveguide) to electrically isolate the gain region 116 and the comb mirror 134 by blocking any electric current that may flow between the gain region 116 and the comb mirror 134 (e.g., due to a potential difference between the contact 610 on the gain region 116 and the contact 615 on the comb mirror 134). In some such embodiments the electrical isolation layer 620 may be created within the passive waveguide layer by removal of material (e.g., creating an air gap) or implanting certain ions (e.g., using helium ion) in a volume inside the waveguide layer.

In some preferred embodiments the length of the passive waveguide 514 (along a longitudinal axis of the laser) maybe larger than half of the width or thickness 512 of the laser or laser chip in a transverse direction in order to provide sufficient thermal isolation. For example, in an InP chip that is 100 µm thick, the passive waveguide (or the thermal isolation region) may be at least 50 µm long. In this example, making the passive waveguide 200 µm long may provide an even stronger thermal isolation. Other variations are possible.

As discussed above, in certain embodiments, such as schematically illustrated by FIG. 7, the first optically active region 120a can be configured to be used as an optical amplifier in a first operating mode of the optical device 500 and as a photodetector in a second operating mode of the optical device 500 (e.g., the first and second operating modes selected by appropriate bias voltage of the first optically active region 120a). In certain such embodiments, in the second operating mode, the first optically active region 120a is used as a shutter and/or optical attenuator configured to control the laser light output of the optical device 500. The second optically active region 120b can be used as a photodetector configured to generate at least one signal to be used in locking the cavity modes to the comb mirror 134 and/or locking the comb mirror 134 to the DBR mirror 130.

In certain embodiments, the DBR mirror 132 is weakly reflecting and the comb mirror 134 is strongly reflecting, while in certain other embodiments, the DBR mirror 132 is strongly reflecting and the comb mirror 134 is weakly reflecting. Accordingly, in certain implementations, the comb mirror 134 can be more reflective than the DBR mirror 132, while in other implementations, the DBR mirror can be more reflective than the comb mirror. In some implementations, the DBR and comb mirrors may have the same reflectivity. In certain embodiments, the DBR mirror 132 is at the first end 310 and the comb mirror 134 is at the second end 312, while in certain other embodiments, the DBR mirror 132 is at the second end 312 and the comb mirror 134 is at the first end 310. Other variations are possible.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments.

Conjunctive language such as the phrase "at least one of X, Y, and Z," unless specifically stated otherwise, is to be understood within the context used in general to convey that an item, term, etc. may be either X, Y, or Z. Thus, such conjunctive language is not generally intended to imply that certain embodiments require the presence of at least one of X, at least one of Y, and at least one of Z.

Language of degree, as used herein, such as the terms "approximately," "about," "generally," and "substantially," represent a value, amount, or characteristic close to the stated value, amount, or characteristic that still performs a desired function or achieves a desired result. For example, the terms "approximately," "about," "generally," and "substantially" may refer to an amount that is within ±10% of, within ±5% of, within ±2% of, within ±1% of, or within ±0.1% of the stated amount. As another example, the terms "generally parallel" and "substantially parallel" refer to a value, amount, or characteristic that departs from exactly parallel by ±10 degrees, by ±5 degrees, by ±2 degrees, by ±1 degree, or by ±0.1 degree, and the terms "generally perpendicular" and "substantially perpendicular" refer to a value, amount, or characteristic that departs from exactly perpendicular by ±10 degrees, by ±5 degrees, by ±2 degrees, by ±1 degree, or by ±0.1 degree.

Various configurations have been described above. Although this invention has been described with reference to these specific configurations, the descriptions are intended to be illustrative of the invention and are not intended to be limiting. Various modifications and applications may occur to those skilled in the art without departing from the true spirit and scope of the invention. Thus, for example, in any method or process disclosed herein, the acts or operations making up the method/process may be performed in any suitable sequence and are not necessarily limited to any particular disclosed sequence. Features or elements from various embodiments and examples discussed above may be combined with one another to produce alternative configurations compatible with embodiments disclosed herein. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A laser comprising:
   at least one gain region including a gain configured to generate light;
   a first optical reflector at one end of the at least one gain region, the first optical reflector having at least one reflection peak in a gain bandwidth of the at least one gain region;
   a second optical reflector having a plurality of reflection peaks at another end of the at least one gain region, the first optical reflector and the second optical reflector forming a cavity including the at least one gain region therein, the cavity having a plurality of cavity modes spaced apart from each other,
   at least one optically active region configured to generate an electric signal indicative of light transmitted from the at least one gain region in a first time period, and to amplify or attenuate the light transmitted from the at least one gain region in a second time period different from the first time period;
   at least one temperature controller configured to adjust the temperature of at least said second optical reflector; and
   electronics configured to align a cavity mode of the plurality of cavity modes with one or both of a reflection peak of the first optical reflector and a reflection peak of the second optical reflector.

2. The laser of claim 1, wherein the second optical reflector comprises a sampled grating distributed Bragg reflector (SGDBR).

3. The laser of claim 1, further comprising a phase section configured to tune a position of the plurality of the cavity modes.

4. The laser of claim 3, wherein said electronics are configured to align the cavity mode with one or both of the reflection peak of the first optical reflector and the second optical reflector by providing a voltage or current to said phase section to tune the cavity mode.

5. The laser of claim 1, wherein the electronics are configured to adjust the temperature of the at least one temperature controller to tune at least one reflection peak of the second optical reflector at least in part based on the electric signal.

6. The laser of claim 1, wherein electronics are configured to adjust the temperature of the at least one temperature controller to align one or more reflection peaks of the second optical reflector with frequency components of a reference telecom frequency grid, said plurality of reflection peaks having a spacing of 25 GHz, 50 GHz, 100 GHz, 200 GHz, 300 GHz, or 500 GHz.

7. The laser of claim 1, wherein electronics are configured to tune a spectral response of the first optical reflector using an injection current or a temperature controller to align the reflection peak of the first optical reflector with the cavity mode or the reflection peak of the second optical reflector at least in part based on the electric signal.

8. The laser of claim 1, wherein the electronics are configured to adjust the temperature of the at least one temperature controller to align the reflection peak of the second optical reflector with the cavity mode based on one or more local extrema, local maxima, local minima, slope or a second derivative at least in part based on the electric signal.

9. The laser of claim 1, further comprising at least one waveguide region positioned between the at least one gain region and the second optical reflector such that the second optical reflector is thermally isolated from the at least one gain region.

10. The laser of claim 1, wherein the at least one optically active region is reversed biased in the first time period.

11. The laser of claim 1, wherein the at least one optically active region is forward biased at least during a portion of the second time period.

* * * * *